(12) United States Patent
Shepsis et al.

(10) Patent No.: US 10,923,876 B1
(45) Date of Patent: Feb. 16, 2021

(54) PHASE-CHANGE MATERIAL (PCM) EMBEDDED HEAT EXCHANGER ASSEMBLY FOR LASER DIODE COOLING AND SYSTEMS AND METHODS THEREOF

(71) Applicant: Lockheed Martin Corporation, Bethesda, MD (US)

(72) Inventors: Aleksandra Shepsis, Bothell, WA (US); David L. Vos, Melbourne Beach, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 16/536,492

(22) Filed: Aug. 9, 2019

(51) Int. Cl.
*H01S 3/04* (2006.01)
*H01S 5/024* (2006.01)

(52) U.S. Cl.
CPC ...... *H01S 5/02423* (2013.01); *H01S 5/02407* (2013.01); *H01S 5/02461* (2013.01); *H01S 5/02476* (2013.01); *H01S 5/024* (2013.01)

(58) Field of Classification Search
CPC ............. H01S 5/02423; H01S 5/02407; H01S 5/02476; H01S 5/02461; H01S 5/024
See application file for complete search history.

(56) References Cited

U.S. PATENT DOCUMENTS

| 4,943,782 A * | 7/1990 | Stephens | H01S 3/005 359/338 |
|---|---|---|---|
| 9,768,584 B2 | 9/2017 | Bandhauer et al. | |
| 9,953,899 B2 | 4/2018 | Chen et al. | |
| 2009/0126922 A1 * | 5/2009 | Vetrovec | F21V 29/70 165/185 |
| 2011/0297911 A1 * | 12/2011 | Shima | H01L 27/2454 257/4 |
| 2013/0025831 A1 | 1/2013 | Attinger et al. | |
| 2017/0082372 A1 * | 3/2017 | Vos | F28D 20/02 |
| 2017/0086822 A1 * | 3/2017 | Scheib | A61B 17/07207 |
| 2018/0043481 A1 | 2/2018 | Vos et al. | |
| 2018/0228053 A1 | 8/2018 | Chainer et al. | |
| 2018/0306524 A1 * | 10/2018 | Horovitz | F28D 20/02 |

FOREIGN PATENT DOCUMENTS

| CN | 107204562 | 9/2017 |
|---|---|---|
| DE | 10 2008 057 963 A1 | 5/2010 |
| WO | WO 2017/053184 A1 | 3/2017 |

\* cited by examiner

*Primary Examiner* — Kinam Park
(74) *Attorney, Agent, or Firm* — Michael Best & Friedrich LLP

(57) ABSTRACT

A heat exchanger configured to cool an energy output device, and systems, devices, and methods thereof, can comprise a heat exchanger housing and an internal chamber defined in the housing that is configured to be filled with a phase-change material (PCM). The internal chamber can be provided at a first predetermined level inside the housing relative to the top surface of the housing and can extend under a first predetermined portion of the top surface of the housing. The internal chamber can include a plurality of PCM channels configured to be filled with the PCM and to accommodate phase changes of the PCM in multiple phase-change directions. Optionally, the plurality of PCM channels can be defined by a plurality of fins and/or the internal chamber can be accessible to outside the housing via at least one PCM interface configured to receive and pass therethrough the PCM.

20 Claims, 5 Drawing Sheets

PHASE-CHANGE MATERIAL (PCM) EMBEDDED HEAT EXCHANGER ASSEMBLY FOR LASER DIODE COOLING AND SYSTEMS AND METHODS THEREOF

SUMMARY

Embodiments of the disclosed subject matter can involve cooling energy output devices, more particularly a heat exchanger embedded with a phase-change material (PCM) to cool an energy output source, and systems, devices, assemblies, and methods thereof.

According to one or more embodiments of the disclosed subject matter, a system can be provided or implemented, where the system can comprise: a plurality of phase-change material (PCM) embedded heat exchangers mounted on an upper surface of a support body, each said PCM embedded heat exchanger being in the form of a cooling cold plate having a top surface and a bottom surface opposite the top surface; and a plurality of laser diodes mounted directly on respective ones of the top surfaces of the plurality of PCM embedded heat exchangers. Each of the plurality of PCM embedded heat exchangers can be configured to cool the respective ones of the plurality of laser diodes, and each of the cooling cold plates can include: an internal coolant chamber configured to receive coolant, the internal coolant chamber being provided at a first level inside the cooling cold plate and being accessible to outside the cooling cold plate via a first coolant interface and a second coolant interface, and an internal PCM chamber configured to be filled with PCM, the internal PCM chamber being provided at a second level inside the cooling cold plate. The internal PCM chamber can extend parallel to the top surface of the cooling cold plate, and the plurality of coolant flow channels can extend parallel to the top surface of the cooling cold plate. The internal PCM chamber can be directly over the internal coolant chamber and substantially overlap the internal coolant chamber in a top plan view of the cooling cold plate, and/or the internal PCM chamber and the internal coolant chamber can be independent from each other.

Additionally, one or more embodiments of the disclosed subject matter can provide or implement a device, where the device can comprise a heat exchanger configured to cool a laser diode, the heat exchanger including: a housing in the form of a plate having a top surface and a bottom surface opposite the top surface, and an internal chamber defined in the housing and configured to be filled with a phase-change material (PCM). The internal chamber can be provided at a first predetermined level inside the housing relative to the top surface of the housing and can extend under a first predetermined portion of the top surface of the housing. The internal chamber can include a plurality of PCM channels configured to be filled with the PCM and to accommodate phase changes of the PCM in multiple phase-change directions. The internal chamber can be accessible to outside the housing via a first PCM interface and a second PCM interface each configured to receive and pass therethrough the PCM, and the plurality of PCM channels can be defined by a plurality of vertical fins.

Embodiments can also include methods of providing, making, and/or using devices and systems, or portions thereof, according to one or more embodiments of the disclosed subject matter.

For example, according to embodiments of the disclosed subject matter, a method can be implemented that comprises: providing a housing in the form of a plate having a top surface and a bottom surface opposite the top surface; and providing an internal chamber defined in the housing and configured to be filled with a phase-change material (PCM). The internal chamber can be provided at a first predetermined level inside the housing relative to the top surface of the housing and can extend under a first predetermined portion of the top surface of the housing, wherein the housing and the internal chamber can form a heat exchanger configured to cool a laser diode. The internal chamber can include a plurality of PCM channels configured to be filled with the PCM and to accommodate phase changes of the PCM in between solid and liquid phases, the plurality of PCM channels being defined by a plurality of fins, and/or the PCM is a wax.

The preceding summary is to provide an understanding of some aspects of the disclosure. As will be appreciated, other embodiments of the disclosure are possible utilizing, alone or in combination, one or more of the features set forth above or described in detail below. Also, while the disclosure is presented in terms of exemplary embodiments, it should be appreciated that individual aspects of the disclosure can be separately claimed.

BRIEF DESCRIPTION OF THE DRAWINGS

The accompanying drawings, which are incorporated in and constitute a part of the specification, are illustrative of one or more embodiments of the disclosed subject matter, and, together with the description, explain various embodiments of the disclosed subject matter. Further, the accompanying drawings have not necessarily been drawn to scale, and any values or dimensions in the accompanying drawings are for illustration purposes only and may or may not represent actual or preferred values or dimensions. Where applicable, some or all select features may not be illustrated to assist in the description and understanding of underlying features.

DETAILED DESCRIPTION

Figure 1:
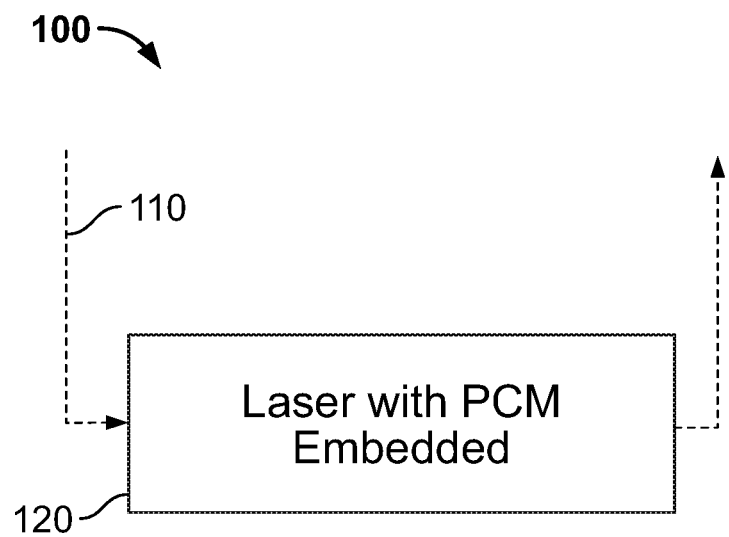
FIG. 1 is a diagram of a system according to embodiments of the disclosed subject matter.

The description set forth below in connection with the appended drawings is intended as a description of various embodiments of the described subject matter and is not necessarily intended to represent the only embodiment(s). In certain instances, the description includes specific details for the purpose of providing an understanding of the described subject matter. However, it will be apparent to those skilled in the art that embodiments may be practiced without these specific details. In some instances, structures and components may be shown in block diagram form in order to avoid obscuring the concepts of the described subject matter. Wherever possible, the same reference numbers will be used throughout the drawings to refer to the same or the like parts.

Any reference in the specification to "one embodiment" or "an embodiment" means that a particular feature, structure, characteristic, operation, or function described in connection with an embodiment is included in at least one embodiment. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments, and it is intended that embodiments of the described subject matter can and do cover modifications and variations of the described embodiments.

It must also be noted that, as used in the specification, appended claims and abstract, the singular forms "a," "an," and "the" include plural referents unless the context clearly dictates otherwise. That is, unless clearly specified otherwise, as used herein the words "a" and "an" and the like carry the meaning of "one or more" or "at least one." The phrases "at least one," "one or more," "or," and "and/or" are open-ended expressions that can be both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" can mean A alone, B alone, C alone, A and B together, A and C together, B and C together, or A, B and C together. It is also to be noted that the terms "comprising," "including," and "having" can be used interchangeably.

It is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the described subject matter to any particular orientation or configuration. Furthermore, terms such as "first," "second," "third," etc. merely identify one of a number of portions, components, points of reference, operations and/or functions as described herein, and likewise do not necessarily limit embodiments of the described subject matter to any particular configuration or orientation.

Embodiments of the disclosed subject matter involve systems, devices, and methods to cool an energy output device, such as a laser diode. The disclosed subject matter may be implemented in various applications, including those that may require or benefit from relatively high heat flux and tight temperature control.

According to embodiments of the disclosed subject matter, a heat exchanger can be embedded with a phase-change material (PCM) and configured to cool an energy output device by direct integration of the PCM-embedded heat exchanger at or with the energy output device (i.e., directly at the hot source). Implementation of the PCM-embedded heat exchanger directly at the energy output device can be according to an entire energy output device basis or, alternatively, on a per-unit energy output device basis. Thus, embodiments of the disclosed subject matter can be configured for thermal management based on peak load of the energy output device(s). For instance, according to one or more embodiments of the disclosed subject matter, each laser diode element or module may be directly integrated or implemented with its own PCM-embedded heat exchanger, thereby distributing the PCM at the laser diode element level. Distributed cooling, according to embodiments of the disclosed subject matter, may alleviate high heat flux that can overwhelm typical PCMs (e.g., dry out phenomenon that starves remaining PCM for >100 W/cm$^2$). Additionally, discussed in more detail below, embodiments of the disclosed subject matter can implement a multi-layered and multi-level integrated design, which can provide for increased burst pressure capacity of a heat exchanger without an increase in weight and volume.

Direct integration of the PCM at or with the energy output device, that is, integration into a consolidated additive assembly with integral cooling (internal and external interfaces) and structural functions, rather than distribution of the PCM separate from the energy output device at a separate heat exchanger (e.g., centralizing the cooling at the system integration level), can address some or all of the following energy system characteristics: latent heat transfer of the PCM can maintain the energy output component (e.g., laser, such as laser diode) according to a relatively tight temperature control; there may not be a need to implement the separate heat exchanger that transfers heat between coolant flowing through the PCM-embedded heat exchanger (in an embodiment that implements coolant flowing through the PCM-embedded heat exchanger); since the separate heat exchanger is not necessary, a separate cooling loop to cool the separate heat exchanger also is not necessary; and can be tolerant to contamination of system-level (e.g., vehicle-level) coolant fluids, since the PCM and/or coolant cavities can be sealed, self-contained systems. Thus, embodiments of the disclosed subject matter can provide cooling architectures with reduced relative size, weight, and power (SWaP) requirements for thermal management of the energy output device(s) via a single-loop system (and not a two-loop system). Embodiments of the disclosed subject matter may also eliminate the need for a relatively complicated long lead cold plate.

Figure 2:
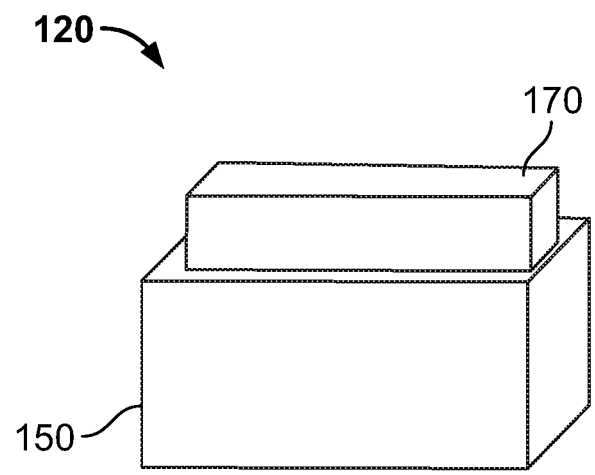
FIG. 2 is a block diagram of a laser diode assembly according to embodiments of the disclosed subject matter.

Turning to the figures, FIG. 1 is a diagram of a system 100 according to embodiments of the disclosed subject matter. The system 100 can have a laser assembly 120 or a plurality of laser assemblies 120. As shown diagrammatically in FIG. 2, and discussed in more detail below, each laser assembly 120 can have a heat exchanger 150 embedded with a phase-change material (PCM) and an energy output device 170, which may be a laser source, such as a laser diode. The energy output device 170 can be provided (e.g., mounted) in thermal communication with the heat exchanger 150. For example, the energy output device 170 may be provided on an upper surface of the heat exchanger 150. As a non-limiting example, the PCM according to embodiments of the disclosed subject matter can change between solid and liquid phases. For instance, the PCM may be a wax, such as a food-based wax. Optionally, the system 100 can have one or more cooling sources 110 configured to cool the PCM and optionally the energy output device(s) 170.

One example of the cooling source 110 is an ambient air source. The ambient air source can provide air to the laser assembly 120 for cooling the PCM and each energy output device 170. Air from the ambient air source may be provided over the laser assembly 120 and/or inside of the laser assembly 120. Moreover, air from the ambient air source may be provided to the laser assembly 120 continuously or selectively, for instance, using a controllable valve or the like (not shown) based on an operational cycle of the energy output device(s) 170 of the laser assembly 120. For example, the air may be selectively provided to the laser assembly 120 to cool the PCM during an off or non-firing phase of the energy output device(s) 170 of the laser assembly 120. For example, the ambient air source can be by way of receiving ram air at a ram air scoop of an aircraft and passing a portion of the air to the laser assembly 120. The air provided to the laser assembly 120 subsequently may be provided to an output and vented to ambient, for instance. Thus, according to one or more embodiments of the disclosed subject matter, the ambient air source can be or can include an Air Cycle Machine (ACM) cooling system or device.

In one or more embodiments of the disclosed subject matter ambient air as the cooling source 110 may be omitted. Thus, embodiments of the disclosed subject matter may operate with or without air provided to the laser assembly 120.

Additionally or alternatively to air, the cooling source 110 according to embodiments of the disclosed subject matter can provide a single-phase coolant (e.g., liquid) and/or a two-phase coolant (e.g., liquid/vapor) to the heat exchanger 150. Such coolant can cool the PCM and optionally the energy output device(s) 170. Non-limiting examples of coolant include wax in the case of PCM and water and a refrigerant (e.g., R134a) in the case of single- and two-phase coolants. Optionally, the coolant system 180, or variations thereof, can provide multiple types of coolant to each heat exchanger 150 or different groups of heat exchangers 150.

Flow of coolant through the heat exchanger 150 may be continuous or periodic, for instance, based on an operational cycle of some or all of the energy output devices 170. For example, the coolant may be selectively provided to the heat exchanger 150 to cool the PCM during an off or non-firing phase of the energy output device 170.

Embodiments of the disclosed subject matter may involve a plurality of laser assemblies 120, which may be provided according to a laser assembly distribution. Optionally, the laser assemblies 120 can be interconnected to form the laser assembly distribution. For example, the heat sinks 150 of the laser assemblies 120 may be relatively small in size (e.g., because they can be created using additive manufacturing) and interconnected via connectors. Thus, the laser assembly distribution may be modular and scalable in that the laser assemblies 120 can be the same or substantially the same (e.g., different types of laser output devices may be used, such as a combination of non-wavelength-stabilized laser diodes and wavelength-stabilized laser diodes) and additional or fewer laser assemblies 120 may be provided, respectively. Optionally, coolant may be circulated through the interconnected heat exchangers 150. For example, coolant may be output from a coolant interface (e.g., second coolant interface) 169 of one heat exchanger 150 to coolant interface (e.g., first coolant interface) 168 of an adjacent heat exchanger 150.

As noted above, the laser assembly 120 can be comprised of a heat exchanger 150 and an energy output device 170 in the form of a laser output device, for example, a laser diode (in the form of a laser diode module, such as a fiber laser module). Laser diodes according to embodiments of the disclosed subject matter can be wavelength-stabilized diodes, non-wavelength-stabilized diodes, or a combination of wavelength-stabilized and non-wavelength-stabilized diodes. Though the present disclosure provides a laser diode as an example of a laser output device, embodiments of the disclosed subject matter are not so limited.

Generally, each heat exchanger 150 can be configured to cool a corresponding energy output device 170. Multi-layered, hollow core structures for heat exchangers can have inherently more robust structural integrity to resist shock, vibration, and pressure differential stresses. Moreover, additive manufacturing (AM) of the heat exchanger 150 can allow the flexibility in the configuration to optimize fin geometry and structure for applications that stiffen the structure for high vibrations and shock applications, which may be a feature beneficial or required for aircraft and naval applications. And the fin(s) can be configured with the PCM to characterize the flow so that the function of the part is gravity insensitive, which may be beneficial or required in aircraft or space applications. Thus, heat exchanger 150, according to embodiments of the disclosed subject matter, can have a relatively high gravitational force shock and vibration tolerance. For example, heat exchangers according to embodiments of the disclosed subject matter may be ruggedized to accommodate for shock loads up to 40 g and/or vibration energy up to 40 gRMS.

Figure 3:
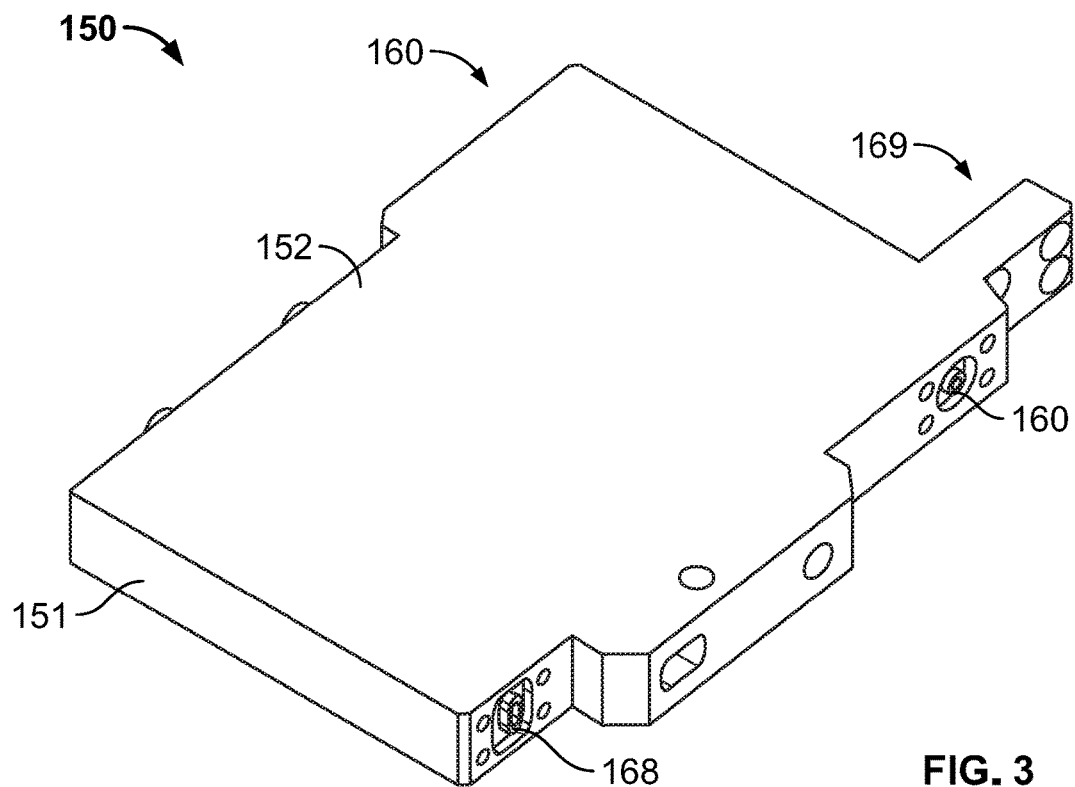
FIG. 3 shows a top, rear, right side perspective view of a PCM embedded heat exchanger of a laser diode assembly according to embodiments of the disclosed subject matter.

Turning to FIG. 3, the heat exchanger 150 can have a body or housing 151. The housing 151 may be configured as a heat sink and may take the form of a plate, for instance, a cooling cold plate. The housing 151 may have a top surface 152 and a bottom surface opposite the top surface 152. The heat exchanger 150 can be a so-called phase-change material (PCM) embedded heat exchanger in that PCM can be filled inside of the heat exchanger 150. The housing 151 can be made from aluminum, copper, silicon carbide, aluminum silicon carbide (AlSiC), ceramic, or a metal matrix composite. Optionally, the housing 151 may be made using an additive manufacturing technique, which can provide an optimal heat transfer area for internal fin structure within the internal chamber 155. The additive manufacturing process can also provide for the capability to create a heat exchanger, such as heat exchanger 150 and variants, with multiple embedded channels that can incorporate multiple coolant options. This can include providing two or more levels that are tied so that heat can be transferred optimally from the heat source (i.e., energy output device 170) and between the coolant(s). Generally speaking, optimal heat transfer can mean providing the most efficient transfer of energy into PCM at minimum temperature rise during longest possible phase transition time.

The energy output device 170 can be provided on the housing 151, for instance, directly on the top surface 152 of the housing 151. The interface between the energy output device 170 and the top surface 152 of the housing 151 can provide a thermal interface between the two components. Optionally, the energy output device 170 can have a footprint on the top surface 152 of the housing 151 that is less than a surface area of the top surface 152 of the housing 151. Such relative dimensions can facilitate mounting of the energy output device 170 to the housing 151 and/or ensure that the heat exchanger 150 has a thermal interface with an entirety of the footprint (i.e., base) of the energy output device 170.

The heat exchanger 150 can have an internal cavity or chamber defined inside the housing 151. The internal chamber can be provided at a predetermined level or height within the housing 151 relative to the top surface 152 of the housing 151 and hence the thermal interface with the energy output device 170. For instance, the internal chamber may be provided adjacent to the top surface 152 of the housing 151 and such no other internal chamber is provided between the internal chamber and the top surface 152 of the housing 151.

The internal chamber can be configured to be filled with PCM and to accommodate phase changes of the PCM in multiple phase-change directions, for instance, from solid to liquid and vice versa. The internal chamber may extend generally in a same direction or parallel to the top surface 152 of the housing 151. In one or more embodiments the internal chamber can be rectangular in the top plan view of the heat exchanger 150. Moreover, the internal chamber can extend under a predetermined portion of the top surface 152 of the housing 151. For instance, the internal chamber can have a profile in a top plan view of the heat exchanger 150 that is set based on a footprint of the energy output device 170 at the interface between the housing 151 and the energy output device 170. This may ensure that the PCM in the internal chamber can cover at least the footprint of the energy output device 170. Optionally, the configuration of the internal chamber may be set based on a temperature profile of the energy output device 170. For instance, if a portion of the energy output device 170 (or other component mounted on the top surface 152) does not generate heat or significant heat, then in some embodiments the internal chamber may not be provided in the housing 151 in association with the non-heat-producing portion(s).

Optionally, the internal chamber may be comprised of multiple levels, an upper level and a lower level, for instance. Embodiments of the disclosed subject matter, however, are not limited to two levels and may implement only a single level or more than two levels. Optionally, other than where the PCM material is introduced and removed from the internal chamber, the upper level and the lower level can be distinct from each other. Thus, the upper level may be considered an upper chamber of the internal chamber, and the lower level may be considered a lower chamber of the internal chamber.

Each of the upper level and the lower level may define channels. The channels of the upper level and the lower level may be referred to as a first set of channels and a second set of channels, respectively. The channels can accommodate and process PCM at a predetermined pressure (or pressure range). In one or more embodiments, the channels may be defined by a plurality of fins. For instance, the fins may be a plurality of vertically oriented fins, though embodiments of the disclosed subject matter are not so limited. Generally, the pitch of the fins may be set based on characteristics of the PCM and other cooling or thermal analysis requirements. As a non-limiting example, the pitch of the fins may be 17 fins/inch. In the case of PCM that changes between solid and liquid (e.g., wax), the fins can allow heat to be transferred from the energy output source 170 to the PCM. Additionally, the PCM, during a fill process, may flow within each level individually in the case of a multi-level configuration, or the PCM may flow between individual levels.

Access to the internal chamber may be provided by way of one or more PCM interfaces or ports (i.e., openings) 160 in the housing 151. FIG. 3 shows two PCM interfaces 160 in the front and rear sides of the housing 151, respectively. Alternatively, multiple (e.g., two) PCM interfaces 160 may be provided on a same side of the housing 151.

Each PCM interface 160 may be configured to receive and pass therethrough PCM. For instance, in one or more embodiments, one of the PCM interfaces 160 may be used to fill the internal chamber 155 with PCM and another of the PCM interfaces 160 may be configured to extract the PCM from the internal chamber 155. Alternatively, each PCM interface 160 may serve to both fill the internal chamber 155 with PCM and extract the PCM from the internal chamber 155. The PCM interfaces 160 may facilitate flow of PCM between the internal chamber 155 and an external PCM circuit during a fill operation and/or extraction operation via the PCM interface(s) 160. In one or more embodiments, the PCM interfaces 160 may be closed with a covering, such as a cap or lid (not expressly shown), that prevents the PCM from escaping.

An internal coolant chamber optionally may be provided in the housing 151. Generally, the internal coolant chamber can be configured to receive coolant from outside the heat exchanger 150 and circulate coolant therein. Circulation of the coolant can cool the PCM in the internal chamber via convective cooling to cause a phase change of the PCM, for instance, from liquid to solid, depending upon the type of PCM. For example, in one or more embodiments the coolant can refreeze the PCM. Circulation of the coolant can also help conduct heat through the entire surface of the heat exchanger 150 (e.g., cold plate).

Though the housing 151 may have an internal coolant chamber, according to one or more embodiments, no coolant may be provided therein. That is, in one or more embodiments, the heat exchanger 150 may operate without coolant in the internal coolant chamber, even though the internal coolant chamber is provided, in which case the PCM alone or the PCM and ambient air may be the only media to cool the energy output device 170.

The internal coolant chamber can be provided at a predetermined level or height within the housing 151 relative to the top surface 152 of the housing 151. As an example, the internal coolant chamber may be provided below the internal chamber. For instance, the internal coolant chamber may be provided directly below the internal chamber such no other internal chamber is provided between the internal chamber and the internal coolant chamber. Additionally or alternatively, the internal coolant chamber may be provided at a same level or height as the internal cavity for PCM. For example, the internal cavity with PCM may have internal cavity portions that alternate with internal coolant chamber portions, where the particular configuration of the internal cavity portions for PCM and the internal coolant chamber portions can be set for optimal performance based on heat load and duty cycle of the energy output device 170. The internal coolant chamber may extend generally in a same direction or parallel to the top surface 152 of the housing 151. Thus, in embodiments of the disclosed subject matter, the internal coolant chamber may extend generally in a same direction or parallel to the internal chamber.

The internal coolant chamber, which can be independent (i.e., fluidly separated) from the internal chamber, can extend relative to a predetermined portion of the internal chamber. Optionally, the internal coolant chamber can match or substantially match the profile of the internal chamber. Thus, in one or more embodiments of the disclosed subject matter the internal coolant chamber can entirely or substantially overlap the internal chamber in a plan view of the heat exchanger 150.

The internal coolant chamber can have one or more coolant flow channels through which coolant can flow. Such one or more channels can accommodate and process the coolant at a predetermined pressure (or pressure range), which may be greater than the predetermined pressure (or pressure range) at which the channels of the internal chamber can accommodate and process the PCM.

Access to the internal coolant chamber may be provided by way of a plurality of coolant interfaces. FIG. 3 shows two coolant interfaces, a first coolant interface 168 and a second coolant interface 169, which may be referred to as a feed or inlet coolant interface and a return or outlet coolant interface, respectively. The first coolant interface 168 and the second coolant interface 169 can be connected (directly or indirectly) to an external coolant circuit or system for the circulation of coolant through the internal coolant chamber. The circulation of coolant through the internal coolant chamber may be continuous or intermittent, for instance, based on a firing cycle of the energy output device 170. For example, in the case of continuous coolant flow the flow rate of the coolant may change based on the firing cycle of the energy output device 170.

In one or more embodiments, the first coolant interface 168 can be connected to a coolant feed line and the second coolant interface 169 can be connected to a coolant return line. In the case of a series of laser assemblies 120, a first heat exchanger 150 in the series may have its first coolant interface 168 connected to the feed line and its second coolant interface 169 connected to a first coolant interface 168 of a next heat exchanger 150 in the series and so on until the last heat exchanger 150 in the series has its second coolant interface 169 connected to the return line. This way coolant can be circulated through all of the heat exchangers in the series using a single coolant flow path.

FIGS. 4A-4F show various aspects of a phase-change material (PCM) embedded heat exchanger 250 according to another embodiment of the disclosed subject matter. The heat exchanger 250 may be considered similar to (and in some cases the same as, such as the general operation of and the laser diode configuration) the heat exchanger 150 described above.

Notably in the heat exchanger 250, the PCM interfaces 260 can be on the same side of the body 251. Likewise, the optional first coolant interface 268 and second coolant interface 269 can be on the same side of the body 251, for instance, opposite the side of the PCM interfaces 260. In one or more embodiments, the PCM interface 260 shown on the left of the body 251 in FIG. 4B may be a port or inlet by which to fill the heat exchanger 250 with PCM, and the PCM interface 260 shown on the right of the body 251 in FIG. 4B may be a port or outlet by which to extract PCM from the heat exchanger 250. In some embodiments the PCM may be filled in the body 251 and the PCM interfaces 260 covered (e.g., with a cap or lid). The PCM interfaces 260 may be coupled to an external circuit configured to cause PCM to circulate through an internal chamber 255 of the body 251 for a PCM filling operation and/or PCM extraction operation.

Figure 4A:
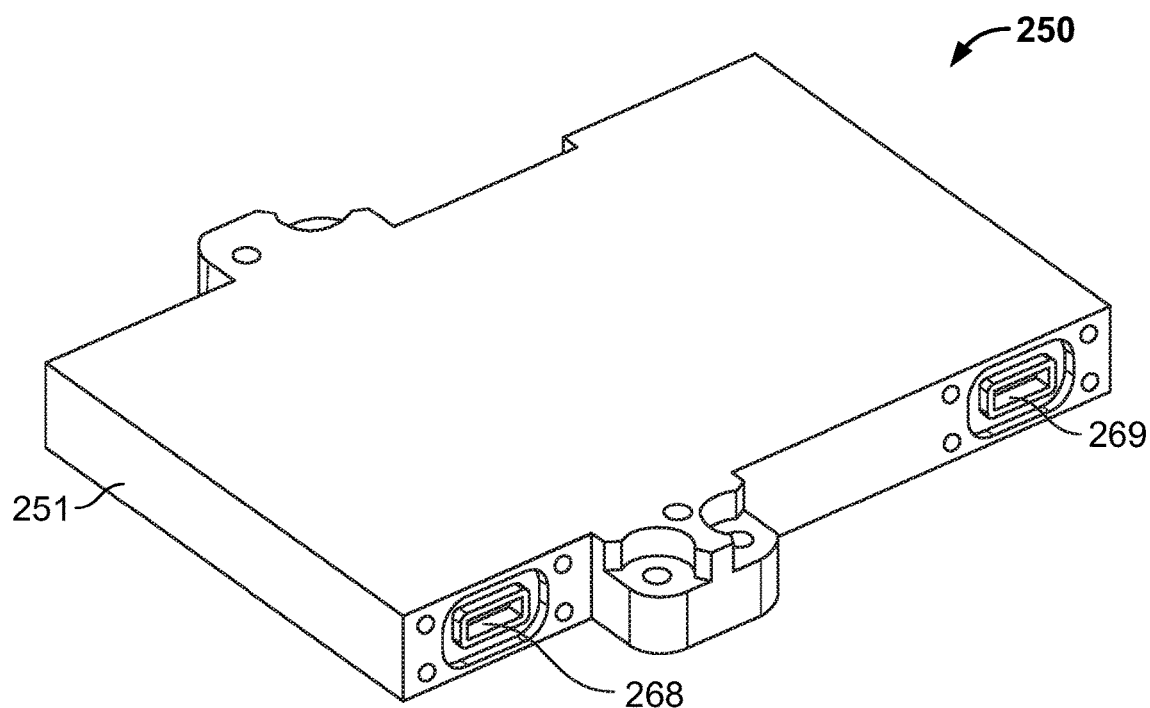
FIG. 4A shows a top, rear, right side perspective view of a PCM embedded heat exchanger according to embodiments of the disclosed subject matter.
Figure 4B:
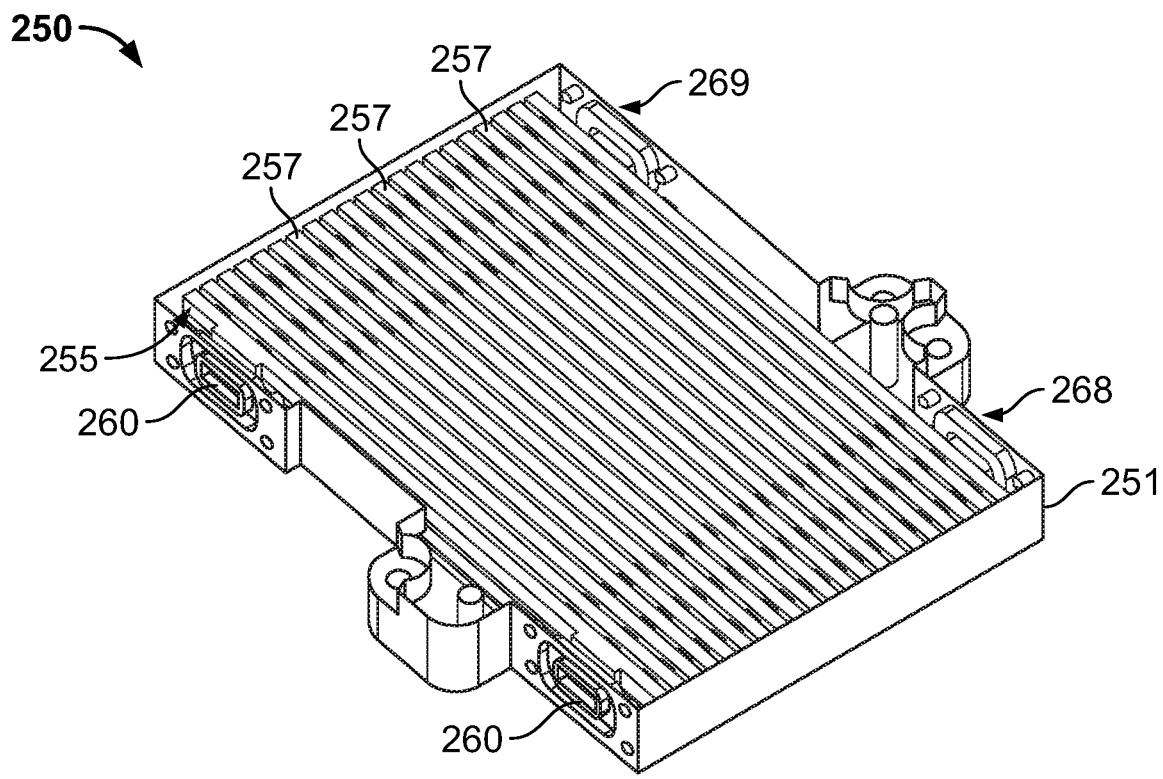
FIG. 4B shows a top, front, right side perspective transparent view of the PCM embedded heat exchanger of the laser diode assembly of FIG. 4A.

FIG. 4B also shows the internal chamber 255 and an internal coolant chamber 265, which can be configured to receive PCM and coolant, respectively, similar to the internal chamber and internal coolant chamber discussed above.

Though the internal chamber 255 in FIG. 4B shows only one level, optionally, the internal chamber 255 may have at least one additional level as described above for heat exchanger 150. As an example, FIGS. 4B-4F show two levels, an upper level 256 and a lower level 258, which may be considered an upper chamber of the internal chamber 255 and a lower chamber of the internal chamber 255, respectively.

Figure 4C:
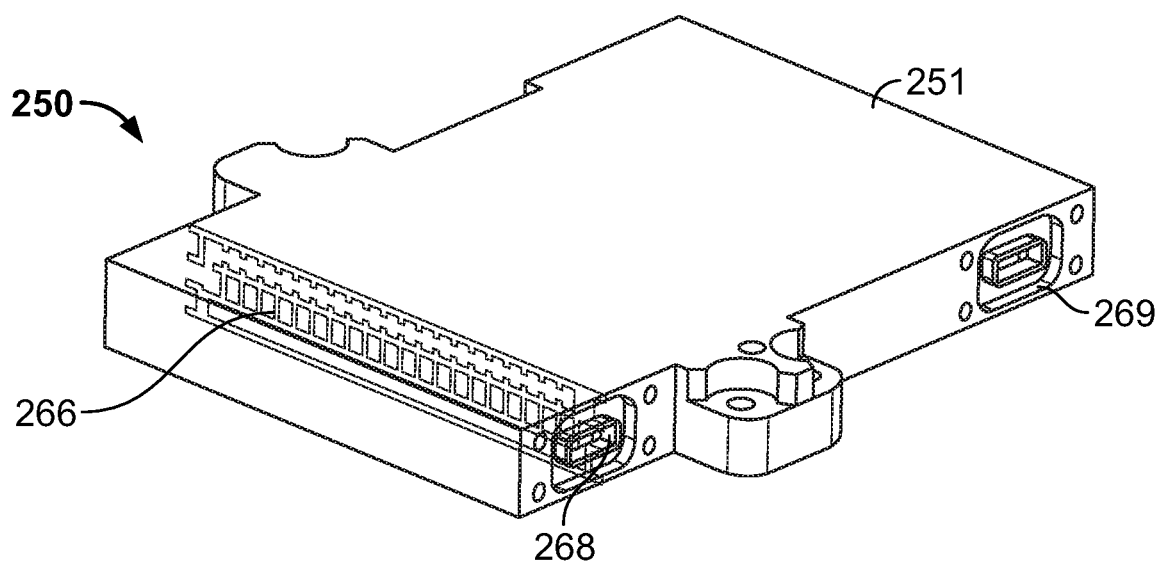
FIG. 4C shows the PCM embedded heat exchanger of FIG. 4B with a portion thereof made transparent.
Figure 4D:
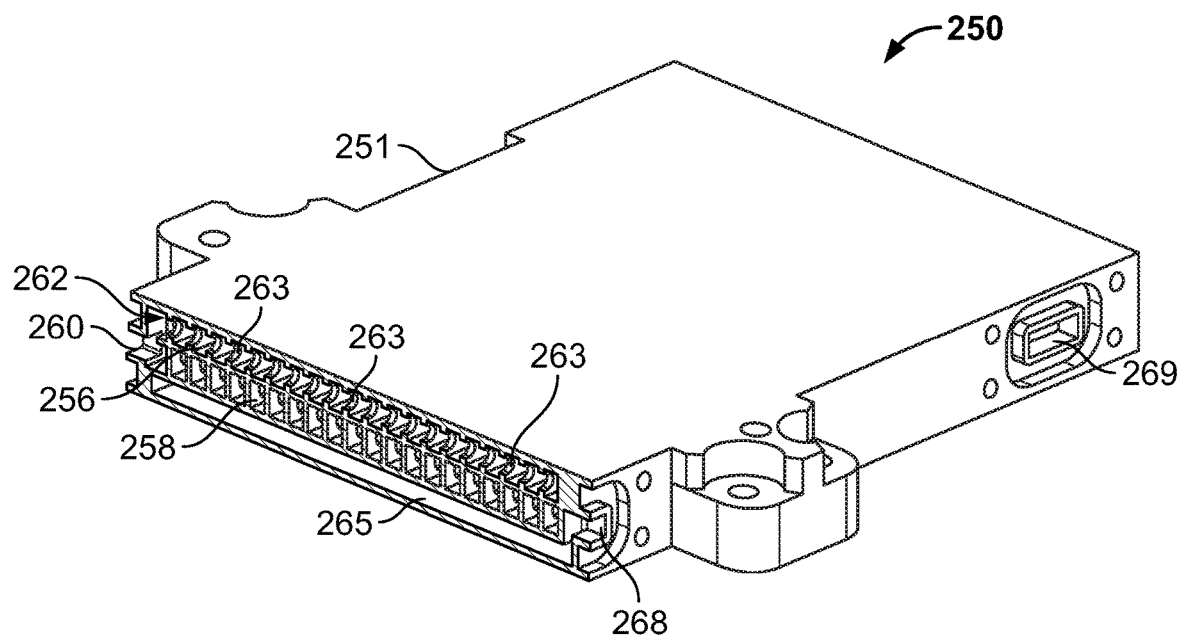
FIG. 4D is a sectional view of FIG. 4C.
Figure 4E:
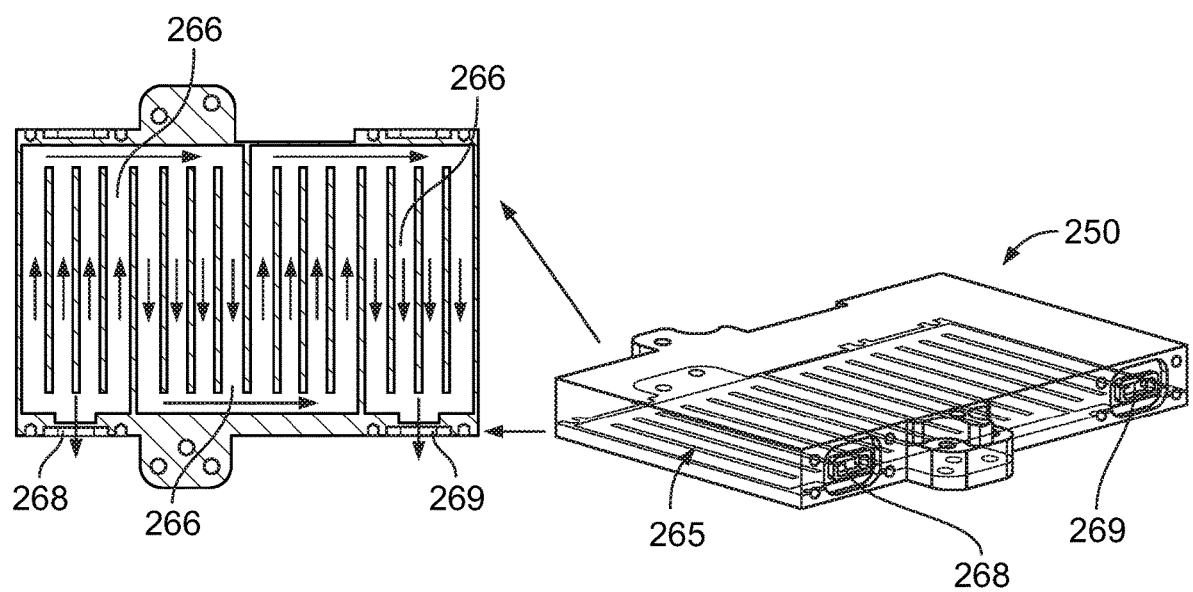
FIG. 4E shows exemplary coolant flow channels and coolant flow of the heat exchanger of FIG. 4A according to embodiments of the disclosed subject matter.
Figure 4F:
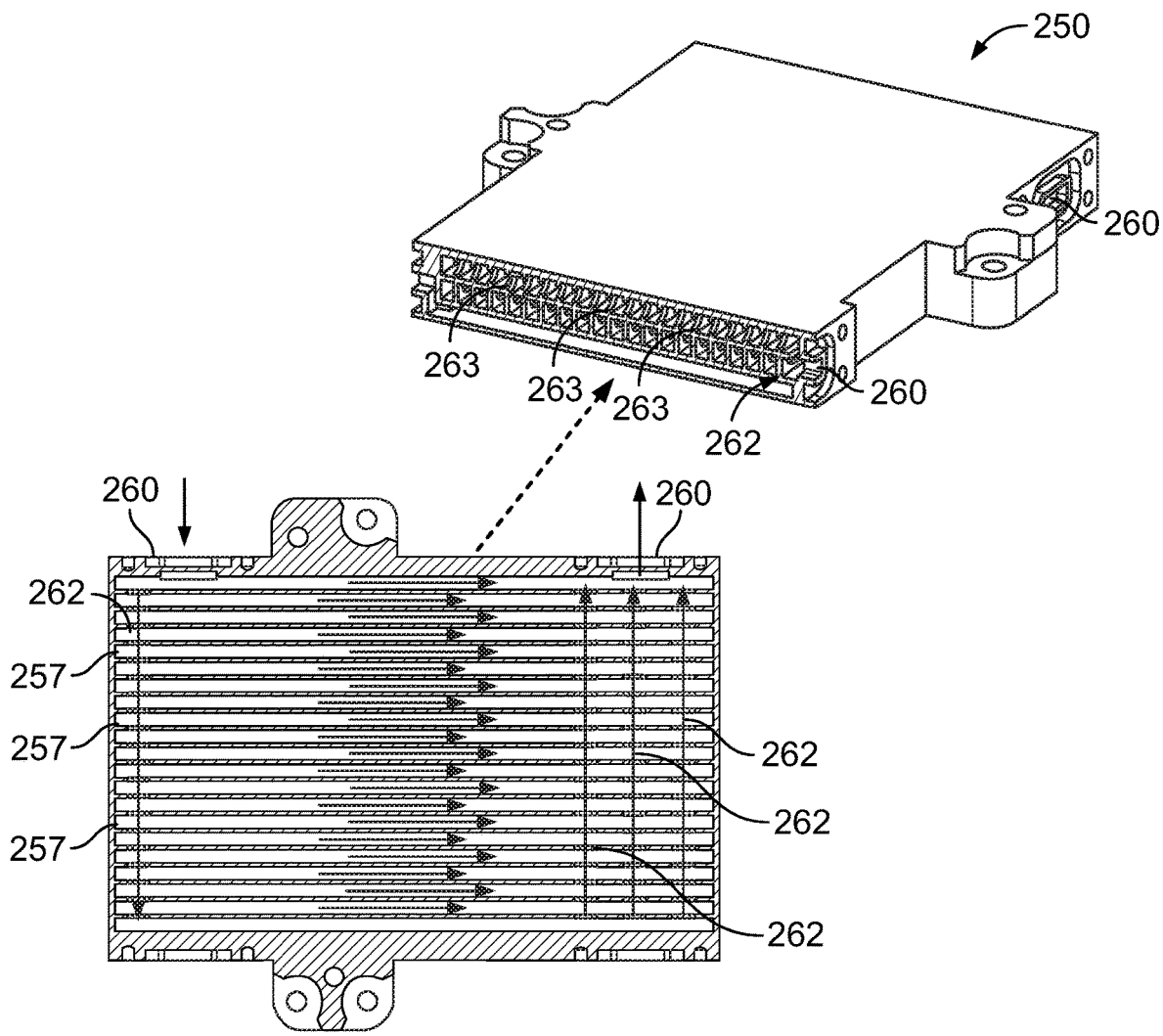
FIG. 4F shows exemplary phase-change material (PCM) channels and PCM path of the heat exchanger of FIG. 4A according to embodiments of the disclosed subject matter.

FIG. 4B, FIG. 4D, and FIG. 4F show exemplary PCM channels 257 that can be provided in the internal chamber 255. The channels 257 can be configured to receive the PCM. Optionally, the channels 257 may run perpendicular to an axis of one or more of the PCM interfaces 260. FIG. 4F also shows an exemplary PCM path for filling and extracting PCM through the internal chamber 255.

One or more manifolds 262 may be provided at each of the PCM interfaces 260. FIG. 4F, for instance, shows one manifold 262 at the PCM interface 260 (e.g., for inputting PCM) on the left side of the body 251 and three manifolds 262 at the PCM interface 260 (e.g., for outputting PCM) on the right side of the body 251. Each manifold 262 may have openings or cutouts 263 to pass PCM. For example, the one manifold 262 may have a plurality of openings 263 to pass PCM to the channels 257, and the three manifolds 262 may have openings 263 to receive PCM from the channels 257 so the PCM can pass from the manifolds 262 to the corresponding PCM interface 260. The location and configuration of the manifold(s) 262 can be provided within a channel so the manifold 162 does not impede cooling of the heat source. Moreover, openings 263 can be provided so they are generally away from or not in the vicinity of a heat source. For example, openings 263 may be provided generally toward a perimeter of the heat exchanger 150 when a heat source or significant heat generating portion of the heat source is more centrally arranged on the heat exchanger 150. Providing manifold(s) 262 with openings 263 can allow for more uniform PCM distribution within a channel and prevent or minimize trapped air.

FIG. 4C, FIG. 4D, and FIG. 4E show an exemplary internal coolant chamber 265 and coolant channels 266 therein. FIG. 4E also shows an exemplary coolant flow path based on the arrangement of coolant channels 266. For example, FIG. 4E shows that some portions of the coolant flow path may be divided (e.g., at the entrance) and portions may be combined (e.g., at the exit). FIG. 4E also shows that one or more portions of the flow path can run parallel to the flow at one or more of the coolant interfaces 268, 269 and one or more portions of the flow path can run perpendicular to the flow at one or more of the coolant interfaces 268, 269. Of course, embodiments of the disclosed subject matter are not limited to the coolant flow path shown in FIG. 4E and, for instance, may provide coolant flow that is neither parallel nor perpendicular to the flow at one or more of the coolant interfaces 268, 269.

As noted above, the first coolant interface 268 and the second coolant interface 269 can be connected (directly or indirectly) to an external coolant circuit or system for the circulation of coolant through the internal coolant chamber 265. The coolant may be caused or controlled to selectively flow (e.g., on/off or fast/slow) through the coolant channels 266. For instance, coolant may be caused or controlled to selectively flow through the coolant channels 266 based on a firing cycle of a corresponding energy output device provided on the heat exchanger 250 (e.g., to refreeze the PCM during a system idle condition) and/or based on some other system requirement. Thus, in one or more embodiments of the disclosed subject matter, the system may cool the energy output device using only the PCM or both the PCM and the coolant.

In some respects, heat exchangers according to embodiments of the disclosed subject matter may be representative of a heat exchanger consolidated within an energy output device module housing.

Notably, embodiments of the disclosed subject matter can maintain energy output device temperature at or near isothermal. This can be achieved with the ability to configure the geometry and utilization of PCM (latent heat transfer) according to embodiments of the disclosed subject matter, as noted above. Volume of PCM can be configured for the specific run-time of the component. Increasing the allowable temperature range of the device can allow for additional run-time with the same volume. This can be further optimized based on liquid flow requirements, fin geometry, and materials (includes coolants).

Figure 5:
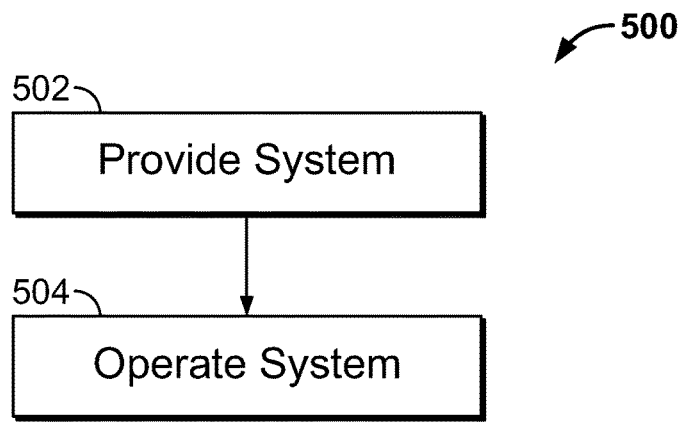
FIG. 5 is a flow chart of a method according to one or more embodiments of the disclosed subject matter.

FIG. 5 is a flow chart of a method 500 according to one or more embodiments of the disclosed subject matter.

At 502 the method 500 can include providing a system or subsystem as described herein. For example, 502 can involve providing some or all of the system 100, such as the laser assembly 120 or the heat exchanger 150, 250.

In terms of heat exchangers according to embodiments of the disclosed subject matter (e.g., heat exchanger 150, 250), the heat exchanger can be made via one or more additive manufacturing techniques (e.g., 3D printing). Among other things, the additive manufacturing process can provide an optimal heat transfer area for the internal fin structure within the internal chamber. The additive manufacturing process can also provide for the capability to create a heat exchanger, such as heat exchanger 150, heat exchanger 250, and variants, with multiple embedded channels that can incorporate multiple coolant options. In some respects, the heat exchanger may be viewed as being created according to individual stacks, for instance, a stack for the internal coolant chamber (e.g., 265) and one or more stacks for the internal chamber for PCM (e.g., 256, 258). The heat exchanger, particularly the housing thereof, can be made from entirely or partially from aluminum, copper, silicon carbide, aluminum silicon carbide (AlSiC), ceramic, a metal matrix composite, or a combination thereof. Optionally, the PCM may also be provided at 502.

At 504 the system, or portion thereof, can be operated. For example, operation can include operating a heat exchanger by controlling a phase of PCM provided in the heat exchanger (e.g., between the solid phase and the liquid phase). Such controlling can be based on or according to a timing of firing a laser diode provided on or in association with the heat exchanger. Operation may also involve cooling the PCM using coolant, such as air or a fluid (e.g., single-phase or two-phase) provided relative to the heat exchanger, such as within and/or on the outside of the heat exchanger.

Embodiments of the disclosed subject matter may also be as set forth according to the parentheticals in the following paragraphs.

(1) A system comprising: a plurality of phase-change material (PCM) embedded heat exchangers mounted on an upper surface of a support body, each said PCM embedded heat exchanger being in the form of a cooling cold plate having a top surface and a bottom surface opposite the top surface; and a plurality of laser diodes mounted directly on respective ones of the top surfaces of the plurality of PCM embedded heat exchangers. Each of the plurality of PCM embedded heat exchangers is configured to cool the respective ones of the plurality of laser diodes, and each of the cooling cold plates includes: an internal coolant chamber configured to receive coolant, the internal coolant chamber being provided at a first level inside the cooling cold plate and being accessible to outside the cooling cold plate via a first coolant interface and a second coolant interface, and an internal PCM chamber configured to be filled with PCM, the internal PCM chamber being provided at a second level inside the cooling cold plate. The internal PCM chamber extends parallel to the top surface of the cooling cold plate, and the plurality of coolant flow channels extend parallel to the top surface of the cooling cold plate, the internal PCM chamber is directly over the internal coolant chamber and substantially overlaps the internal coolant chamber in a top plan view of the cooling cold plate, and/or the internal PCM chamber and the internal coolant chamber are independent from each other.

(2) The system according to (1), wherein the internal PCM chamber is comprised of an upper level and a lower level having a first set of the plurality of PCM channels and a second set of the plurality of PCM channels, respectively.

(3) The system according to (1) or (2), wherein the internal PCM chamber is accessible to outside the cooling cold plate via a first PCM interface and a second PCM interface.

(4) The system according to any one of (1) to (3), wherein the plurality of PCM channels of the internal PCM chamber are defined by a plurality of vertical fins.

(5) The system according to any one of (1) to (4), further comprising the coolant and/or the PCM.

(6) The system according to any one of (1) to (5), wherein the coolant flow channels are configured to process the coolant at a first pressure, and the PCM channels are configured to process the PCM at a second pressure less than the first pressure.

(7) The system according to any one of (1) to (6), wherein the system is configured to cool the laser diodes mounted on the respective cooling cold plates by selectively controlling the coolant through the coolant flow channels to cool and change a state of the PCM according to an on-off operation cycle of the laser diodes.

(8) A device comprising: a heat exchanger configured to cool a laser diode, the heat exchanger including: a housing in the form of a plate having a top surface and a bottom surface opposite the top surface, and an internal chamber defined in the housing and configured to be filled with a phase-change material (PCM), the internal chamber being provided at a first predetermined level inside the housing relative to the top surface of the housing and extending under a first predetermined portion of the top surface of the housing. The internal chamber includes a plurality of PCM channels configured to be filled with the PCM and to accommodate phase changes of the PCM in multiple phase-change directions, the internal chamber is accessible to outside the housing via a first PCM interface and a second PCM interface each configured to receive and pass therethrough the PCM, and/or the plurality of PCM channels are defined by a plurality of vertical fins.

(9) The device according to (8), wherein the internal chamber is comprised of an upper level and a lower level having a first set of the plurality of PCM channels and a second set of the plurality of PCM channels, respectively.

(10) The device according to (8) or (9), wherein a configuration of the internal chamber is based on a temperature profile of the laser diode.

(11) The device according to any one of (8) to (10), wherein the housing, including the vertical fins, is homogenous and formed of a same material.

(12) The device according to any one of (8) to (11), further comprising an internal coolant chamber defined in the housing and configured to receive coolant and cool the PCM in the internal chamber, wherein the internal chamber and the internal coolant chamber are independent from each other, wherein the internal coolant chamber is provided at a second predetermined level inside the housing relative to the top surface of the housing and extending under a predetermined portion of the internal chamber, and/or wherein internal coolant chamber has a plurality of coolant flow channels.

(13) The device according to any one of (8) to (12), wherein the predetermined level of the internal chamber is closer to the top surface of the housing than the second predetermined level of the internal coolant chamber.

(14) A method comprising: providing a housing in the form of a plate having a top surface and a bottom surface opposite the top surface; and providing an internal chamber defined in the housing and configured to be filled with a phase-change material (PCM), the internal chamber being provided at a first predetermined level inside the housing relative to the top surface of the housing and extending under a first predetermined portion of the top surface of the housing, wherein the housing and the internal chamber form a heat exchanger configured to cool a laser diode. The internal chamber includes a plurality of PCM channels configured to be filled with the PCM and to accommodate phase changes of the PCM in between solid and liquid phases, where the plurality of PCM channels are defined by a plurality of fins, and/or the PCM is a wax.

(15) The method according to (14), further comprising operating the heat exchanger by controlling a phase of the PCM between the solid phase and the liquid phase according to a timing of firing the laser diode, wherein control of the phase of the PCM to the solid phase involves cooling the PCM using a coolant.

(16) The method according to (14) or (15), wherein the coolant is one or more of air, a single-phase coolant, and a two-phase coolant.

(17) The method according to any one of (14) to (16), further comprising providing an internal coolant chamber defined in the housing, the internal coolant chamber being configured to provide the coolant to cool the PCM.

(18) The method according to any one of (14) to (17), wherein said operating the heat exchanger includes circulating the coolant between the internal coolant chamber and a coolant circuit external to the housing by way of a first coolant interface and a second coolant interface of the housing.

(19) The method according to any one of (14) to (18), wherein said providing the housing and said providing the internal chamber defined in the housing includes forming the housing and the internal chamber by additive manufacturing.

(20) The method according to any one of (14) to (19), wherein the internal chamber is comprised of an upper level and a lower level having a first set of the plurality of PCM channels and a second set of the plurality of PCM channels, respectively.

Having now described embodiments of the disclosed subject matter, it should be apparent to those skilled in the art that the foregoing is merely illustrative and not limiting, having been presented by way of example only. Thus, although particular configurations have been discussed and illustrated herein, other configurations can be and are also employed. Further, numerous modifications and other embodiments (e.g., combinations, rearrangements, etc.) are enabled by the present disclosure and are contemplated as falling within the scope of the disclosed subject matter and any equivalents thereto. Features of the disclosed embodiments can be combined, rearranged, omitted, etc., within the scope of described subject matter to produce additional embodiments. Furthermore, certain features may sometimes be used to advantage without a corresponding use of other features. Accordingly, Applicant intends to embrace all such alternatives, modifications, equivalents, and variations that are within the spirit and scope of the present disclosure. Further, it is therefore to be understood that within the scope of the appended claims, the disclosure may be practiced otherwise than as specifically described herein.

What is claimed is:

1. A system comprising:
    a plurality of phase-change material (PCM) embedded heat exchangers mounted on an upper surface of a support body, each said PCM embedded heat exchanger being in the form of a cooling cold plate having a top surface and a bottom surface opposite the top surface; and
    a plurality of laser diodes mounted directly on respective ones of the top surfaces of the plurality of PCM embedded heat exchangers,
    wherein each of the plurality of PCM embedded heat exchangers is configured to cool the respective ones of the plurality of laser diodes,
    wherein each of the cooling cold plates includes:
        an internal coolant chamber configured to receive coolant, the internal coolant chamber being provided at a first level inside the cooling cold plate and being accessible to outside the cooling cold plate via a first coolant interface and a second coolant interface,
        an internal PCM chamber configured to be filled with PCM, the internal PCM chamber being provided at a second level inside the cooling cold plate,
    wherein the internal PCM chamber extends parallel to the top surface of the cooling cold plate, and the plurality of coolant flow channels extend parallel to the top surface of the cooling cold plate,
    wherein the internal PCM chamber is directly over the internal coolant chamber and substantially overlaps the internal coolant chamber in a top plan view of the cooling cold plate, and
    wherein the internal PCM chamber and the internal coolant chamber are independent from each other.

2. The system according to claim 1, wherein the internal PCM chamber is comprised of an upper level and a lower level having a first set of the plurality of PCM channels and a second set of the plurality of PCM channels, respectively.

3. The system according to claim 1, wherein the internal PCM chamber is accessible to outside the cooling cold plate via a first PCM interface and a second PCM interface.

4. The system according to claim 1, wherein the plurality of PCM channels of the internal PCM chamber are defined by a plurality of vertical fins.

5. The system according to claim 1, further comprising the coolant and/or the PCM.

6. The system according to claim 1, wherein the coolant flow channels are configured to process the coolant at a first pressure, and the PCM channels are configured to process the PCM at a second pressure less than the first pressure.

7. The system according to claim 1, wherein the system is configured to cool the laser diodes mounted on the respective cooling cold plates by selectively controlling the coolant through the coolant flow channels to cool and change a state of the PCM according to an on-off operation cycle of the laser diodes.

8. A device comprising:
    a heat exchanger configured to cool a laser diode, the heat exchanger including:
        a housing in the form of a plate having a top surface and a bottom surface opposite the top surface,
        an internal chamber defined in the housing and configured to be filled with a phase-change material (PCM), the internal chamber being provided at a first predetermined level inside the housing relative to the top surface of the housing and extending under a first predetermined portion of the top surface of the housing,
    wherein the internal chamber includes a plurality of PCM channels configured to be filled with the PCM and to accommodate phase changes of the PCM in multiple phase-change directions, wherein the internal chamber is accessible to outside the housing via a first PCM interface and a second PCM interface each configured to receive and pass therethrough the PCM, and wherein the plurality of PCM channels are defined by a plurality of vertical fins.

9. The device according to claim 8, wherein the internal chamber is comprised of an upper level and a lower level having a first set of the plurality of PCM channels and a second set of the plurality of PCM channels, respectively.

10. The device according to claim 8, wherein a configuration of the internal chamber is based on a temperature profile of the laser diode.

11. The device according to claim 8, wherein the housing, including the vertical fins, is homogenous and formed of a same material.

12. The device according to claim 8, further comprising an internal coolant chamber defined in the housing and configured to receive coolant and cool the PCM in the internal chamber, wherein the internal chamber and the internal coolant chamber are independent from each other, wherein the internal coolant chamber is provided at a second predetermined level inside the housing relative to the top surface of the housing and extending under a predetermined portion of the internal chamber, and wherein internal coolant chamber has a plurality of coolant flow channels.

13. The device according to claim 12, wherein the predetermined level of the internal chamber is closer to the top surface of the housing than the second predetermined level of the internal coolant chamber.

14. A method comprising:

providing a housing in the form of a plate having a top surface and a bottom surface opposite the top surface; and providing an internal chamber defined in the housing and configured to be filled with a phase-change material (PCM), the internal chamber being provided at a first predetermined level inside the housing relative to the top surface of the housing and extending under a first predetermined portion of the top surface of the housing, wherein the housing and the internal chamber form a heat exchanger configured to cool a laser diode, wherein the internal chamber includes a plurality of PCM channels configured to be filled with the PCM and to accommodate phase changes of the PCM in between solid and liquid phases, wherein the plurality of PCM channels are defined by a plurality of fins, and wherein the PCM is a wax.

15. The method according to claim 14, further comprising operating the heat exchanger by controlling a phase of the PCM between the solid phase and the liquid phase according to a timing of firing the laser diode, wherein control of the phase of the PCM to the solid phase involves cooling the PCM using a coolant.

16. The method according to claim 15, wherein the coolant is one or more of air, a single-phase coolant, and a two-phase coolant.

17. The method according to claim 15, further comprising providing an internal coolant chamber defined in the housing, the internal coolant chamber being configured to provide the coolant to cool the PCM.

18. The method according to claim 17, wherein said operating the heat exchanger includes circulating the coolant between the internal coolant chamber and a coolant circuit external to the housing by way of a first coolant interface and a second coolant interface of the housing.

19. The method according to claim 14, wherein said providing the housing and said providing the internal chamber defined in the housing includes forming the housing and the internal chamber by additive manufacturing.

20. The method according to claim 14, wherein the internal chamber is comprised of an upper level and a lower level having a first set of the plurality of PCM channels and a second set of the plurality of PCM channels, respectively.

* * * * *